(12) United States Patent
Cottin et al.

(10) Patent No.: US 7,714,390 B2
(45) Date of Patent: May 11, 2010

(54) INTEGRATED CIRCUIT COMPRISING A SUBSTRATE AND A RESISTOR

(75) Inventors: Denis Cottin, Crolles (FR); Thierry Schwartzmann, Le Versoud (FR); Jean-Charles Vildeuil, Saint Martin D'heres (FR); Bertrand Martinet, Eybens (FR); Sophie Taupin, Grenoble (FR); Mathieu Marin, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 11 days.

(21) Appl. No.: 11/385,044

(22) Filed: Mar. 20, 2006

(65) Prior Publication Data

US 2006/0226512 A1    Oct. 12, 2006

(30) Foreign Application Priority Data

Apr. 1, 2005    (FR) .................................. 05 03201

(51) Int. Cl.
H01L 23/62    (2006.01)

(52) U.S. Cl. ............................. 257/358; 257/E29.176

(58) Field of Classification Search ......... 257/350–363, 257/379, 380, E29.176
See application file for complete search history.

(56) References Cited

U.S. PATENT DOCUMENTS

| 4,228,450 | A |   | 10/1980 | Anantha et al. |         |
|-----------|---|---|---------|----------------|---------|
| 4,418,469 | A |   | 12/1983 | Fujita         |         |
| 4,544,937 | A |   | 10/1985 | Kroger         |         |
| 4,560,583 | A |   | 12/1985 | Moksvold       |         |
| 4,700,456 | A | * | 10/1987 | Bruchez        | 438/330 |
| 5,021,860 | A | * | 6/1991  | Bertotti et al.| 257/552 |
| 5,114,868 | A |   | 5/1992  | Yoshida        |         |
| 5,204,541 | A | * | 4/1993  | Smayling et al.| 257/138 |
| 5,286,670 | A |   | 2/1994  | Kang et al.    |         |
| 5,302,534 | A |   | 4/1994  | Monk et al.    |         |
| 5,308,776 | A |   | 5/1994  | Gotou          |         |
| 5,506,528 | A |   | 4/1996  | Cao et al.     |         |
| 5,545,909 | A | * | 8/1996  | Williams et al.| 257/355 |
| 5,654,574 | A | * | 8/1997  | Williams et al.| 257/355 |

(Continued)

FOREIGN PATENT DOCUMENTS

JP          63086565 A        4/1988

OTHER PUBLICATIONS

Patent Abstracts of Japan, vol. 014, No. 032 (E-876) Jan. 22, 1990 & JP 01 268048 A Sony Corporation, Oct. 1989.
Patent Abstracts of Japan, vol. 011, No. 169 (E-511), May 30, 1987 & JP 62 001259 A, Sharp Corporation, Jan. 7, 1987.
Patent Abstracts of Japan, vol. 014, No. 032 (E-876), Jan. 22, 1990 & JP 01 268050A, Sony Corporation, Oct. 25, 1989.
Patent Abstracts of Japan, vol. 005, No. 055 (E-052), Apr. 16, 1981.
Preliminary French Search Report, FR 05 03201, dated Dec. 2, 2005.
Seidel et al., "Buried-Guarded Layer Ion-Implanted Resistors", IEEE Transactions on Electron Devices, vol. ED-20, No. 8, Aug. 1973, pp. 744-748 (7 pages).

*Primary Examiner*—Brook Kebede
(74) *Attorney, Agent, or Firm*—Gardere Wynne Sewell LLP

(57) ABSTRACT

An integrated circuit includes a substrate and a resistor. The resistor is formed from at least two access wells of a first conductivity type and a deep buried layer electrically connecting the wells. The deep buried layer is at least partly covered by a region of opposite conductivity.

14 Claims, 1 Drawing Sheet

U.S. PATENT DOCUMENTS

| | | |
|---|---|---|
| 5,760,450 A | 6/1998 | Hurkx et al. |
| 5,994,759 A | 11/1999 | Darmawan et al. |
| 6,057,204 A | 5/2000 | Nowak et al. |
| 6,169,310 B1 * | 1/2001 | Kalnitsky et al. ............ 257/355 |
| 6,180,478 B1 | 1/2001 | Lee et al. |
| 6,218,866 B1 * | 4/2001 | Poplevine et al. ............ 326/103 |
| 6,265,248 B1 | 7/2001 | Darmawan et al. |
| 6,274,422 B1 | 8/2001 | Wakita |
| 6,300,668 B2 | 10/2001 | Miller, Jr. et al. |
| 6,441,460 B1 | 8/2002 | Viebach et al. |
| 6,690,082 B2 | 2/2004 | Lakshmikumar |
| 6,693,325 B1 | 2/2004 | Ko et al. |
| 7,012,307 B2 * | 3/2006 | Lin et al. ..................... 257/360 |
| 2004/0207045 A1 | 10/2004 | Imoto |
| 2005/0287756 A1 * | 12/2005 | Suzuki et al. ................ 438/382 |
| 2007/0194390 A1 * | 8/2007 | Chinthakindi et al. ........ 257/379 |

* cited by examiner

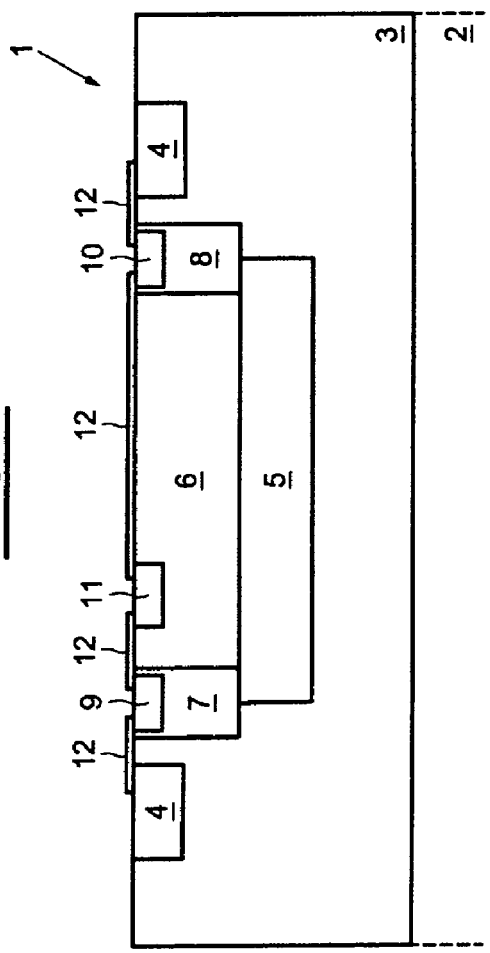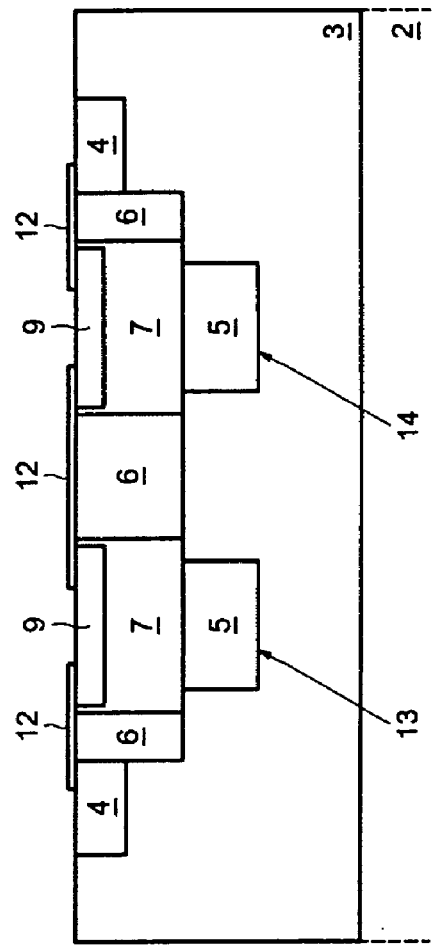

INTEGRATED CIRCUIT COMPRISING A SUBSTRATE AND A RESISTOR

PRIORITY CLAIM

The present application claims priority from French Application for Patent No. 05 03201 filed Apr. 1, 2005, the disclosure of which is hereby incorporated by reference.

BACKGROUND OF THE INVENTION

1. Technical Field of the Invention

The present invention relates to integrated circuits and more particularly to resistors or resistive paths.

2. Description of Related Art

In many electronic applications, active components, such as transistors, are connected to passive components, especially resistors.

It is therefore desirable to produce resistors within an integrated circuit. Such resistors must be able to have a high resistance in order to reduce the current and the energy consumption, in particular in analog applications and/or wireless devices.

Moreover, in the case of voltage regulators, there are two resistors are placed in series at the output of a transistor that have to be particularly well matched in terms of resistance, low-frequency noise and linearity.

Applicants have noticed that when a resistor is formed in a film of a given conductivity type, n or p, surrounded by insulating regions made of amorphous material, for example $SiO_2$, the noise of such resistors is high and liable to vary greatly from one resistor to another.

Applicants believe that this phenomenon is due to a material mismatch between the crystalline material forming the resistor and the amorphous or polycrystalline material of the adjacent insulating regions. Because of the mismatch in the crystal lattice at this point, there are a number of vacancies liable to trap or emit electrons, thus generating noise when an electric current flows. The number of these vacancies depends on the area of the resistor in contact with the insulating region.

The present invention aims to remedy these drawbacks. There is a need in the art to produce a resistor or a resistive path in an integrated circuit that has a low noise, especially at low frequency, has reproducible performance from one resistor to another and, where appropriate, has a high resistance.

SUMMARY OF THE INVENTION

In a embodiment of the invention, an integrated circuit comprises a circuit and a resistor. The resistor comprises at least two access wells of a first conductivity type and a deep buried layer electrically connecting the access wells. The deep buried layer is at least partly covered by a region of opposite conductivity. Thus contact between the deep buried layer made of crystalline material and an amorphous or polycrystalline material of another region is avoided. The low-frequency noise may thus be reduced by a factor of more than 1000.

In one embodiment, the resistor is isolated from the region of opposite conductivity by the junction between the resistor of the first conductivity type and the region of opposite conductivity. The region of opposite conductivity may take the form of a well, placed especially between the two access wells and substantially at the same level.

In one embodiment, the substrate is of opposite conductivity. The resistor is thus surrounded by a substrate and a well, both of opposite conductivity, hence providing junction isolation.

In one embodiment, the material of the deep buried layer and the material of the region of opposite conductivity exhibit crystal lattice continuity. The low-frequency noise is greatly reduced. The deep buried layer, the access wells, the region of opposite conductivity and an epilayer may exhibit crystal lattice continuity.

In one embodiment, the deep buried layer is of the first conductivity type.

In one embodiment, the deep buried layer is lightly doped and implanted at high-energy. The deep buried layer may thus be doped with a lower concentration than that of deep buried layers forming part of transistors.

In one embodiment, the collector wells are in contact with respective contacts of the first conductivity type. The contacts may be provided with an upper surface surrounded by a layer for protection against silicidation. The contacts may thus be in direct contact with a conducting region based on a metal silicide and are isolated from one another by a layer of small thickness, for example based on silicon, especially the first silicon oxide layer of interconnection levels or a silicon nitride layer.

In one embodiment, the region of opposite conductivity is lightly doped. The light doping of the region of opposite conductivity results in greater depletion on the side of the layer of opposite conductivity and lesser depletion on the side of the deep buried layer, thereby improving the linearity of the resistor in the deep buried layer.

In one embodiment, the integrated circuit comprises two matched resistors, the access wells of the two resistors being separated by the region of opposite conductivity. It is thus possible to form two resistors associated with the same region of opposite conductivity, also called wells, hence excellent matching of the resistors.

The deep buried layer is preferably placed in the substrate, for example at a level below that of the shallow trench isolations and at a certain distance from silicon oxide layers.

In another embodiment, an integrated circuit comprises a substrate and first and second matched resistors formed in the substrate. Each resistor comprises at least two access wells of a first conductivity type and a deep buried layer electrically connecting the two access wells, the deep buried layer being at least partly covered by a region of opposite conductivity type. A first access well of the first resistor and a corresponding first access wells of the second resistor are separated by the region of opposite conductivity type.

In another embodiment, an integrated circuit resistor comprises a lightly doped deep buried layer of a first conductivity type. A well region of a second conductivity type overlies the lightly doped deep buried layer. First and second access wells also of the first conductivity type penetrate past the well region to contact the lightly doped deep buried layer at first and second points thereof.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a schematic view in vertical section of an integrated circuit; and

FIG. 2 is a schematic view in vertical section in a plane perpendicular to the preceding one of the integrated circuit of FIG. 1.

DETAILED DESCRIPTION OF THE PREFERRED EMBODIMENTS

As may be seen in the figures, the integrated circuit referenced 1 in its entirety is formed from a substrate 2 of p-type conductivity, for example based on single-crystal silicon surmounted by an epilayer 3, also of p type. Formed in the epilayer 3 are a plurality of shallow trench isolations 4 or STIs that are formed over part of the thickness of the epilayer 3 starting from its upper surface in order to create the isolation between two active regions.

A deep buried layer 5 is formed in the substrate 2 within the epilayer 3 and has an n type conductivity. The deep buried layer 5 may be formed by high-energy implantation of dopants with a low concentration. Lying above the deep buried layer 5 is a well 6 of p type conductivity. Preferably, the well 6 is lightly doped, especially with respect to the doping normally used to fabricate transistors. However, it is possible to envisage a conventionally doped well 6. Implanted between the well 6 and the epilayer 3 are access wells 7 and 8 of n type conductivity positioned at least partly on the upper surface of the deep buried layer 5. The access wells 7 and 8 are in electrical contact with the deep buried layer 5. The access wells 7 and 8 may be produced by doping with concentrations normally used in the field of transistor fabrication.

Collector contacts 9 and 10 are produced in the upper part of the access wells 7 and 8 in order to ensure good electrical contact with elements (not shown) that will be subsequently placed on top of the integrated circuit 1, especially the metal lines and vias of interconnection levels. Likewise, a well contact 11 is formed in a localized upper part of the well 6 and allows the well 6 to be maintained at a desired voltage, generally earth/ground.

Formed on the upper surface of the integrated circuit 1 is a protective layer 12, for example based on silicon oxide, which is insulating and serves as protection against silicidization. This is because a metal silicide layer, for example a $CoSi_2$ layer, is generally formed on the upper surface of the contacts 9, 10 and 11, the silicide layer favoring electrical contact with the interconnection levels. The contact 11 is optional, as electrical continuity exists between the layer 6 and the layer 3. The protective layer 12 prevents the formation of short circuits between the contacts 9, 10 and 11.

Since the deep buried layer 5, the access wells 7 and 8 and the contacts 9 and 10 are of the same conductivity, there is excellent electrical contact at their respective interfaces. Likewise, the substrate 2, the epilayer 3 and the well 6 are of the same conductivity and generally there is excellent electrical contact at their respective interfaces.

In contrast, the deep buried layer 5 and the access wells 7 and 8, on the one hand, and the substrate 2, the epilayer 3 and the well 6 on the other hand, of opposite conductivities, exhibit a depletion effect at their respective interfaces, which results in electrical isolation and the fact that the lines of current flowing from the contact 9 to the contact 10, or the other way round, pass via the access wells 7 and 8 and the deep buried layer 5 and not via the substrate 2, the epilayer 3 or the well 6.

The resistor thus obtained is very well isolated from the adjacent layers and exhibits particularly low low-frequency noise thanks to the absence or virtual absence of free bonds at the interfaces between the regions forming the resistor and the adjacent regions.

Advantageously, the integrated circuit 1 may comprise a very large number of resistors, of identical structure and of substantially identical resistance, these being connected in series in desired numbers in order to form an overall resistor of the desired resistance.

As an example, the fact of forming several 500 kΩ resistors each from twenty 25 kΩ resistors makes it possible for the influence of the fabrication variations and dispersions to be very greatly reduced and for good matching of the 500 kΩ resistors to be obtained.

As may be seen in FIG. 2, the plane of section of which is perpendicular to that of FIG. 1, a single well 6 may be associated with two resistors 13 and 14, each comprising a deep buried layer 5, a first collector well 7 provided with a collector contact 9 and another collector well (not visible in the plane of section) identical to the collector 8 of FIG. 1, also associated with a collector contact.

The two buried layers 5 of the resistors 13 and 14 are placed a certain distance apart and extend substantially parallel to and isolated from each other by the depletion effect at their interface with the substrate 2 and the well 6. Thus, two very well-matched resistors can be formed, because of the elimination of the fabrication dispersions due to the well difference and the proximity of the resistors.

Thus, it is possible to prevent any contact between the shallow trench isolations 4 and a resistive buried layer, thereby making it possible for the low-frequency noise to be very greatly reduced. In other words, the value of the resistance varies very little with the voltage applied to it.

Such a resistor may be obtained in various technologies, especially CMOS or BICMOS, and advantageously applies to linear regulators, for example to the supply regulators for voltage-controlled oscillators in phase-lock loops for analog, radio frequency or wireless applications. The conductivities of the example described may be reversed, it being possible for the substrate and the well to be of n-type conductivity and the deep buried layer and the collector wells to be of p type conductivity.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit comprising:
   a substrate; and
   a resistor formed in the substrate, the resistor having a first collector contact and a second collector contact and a resistive electrical path extending between the first collector contact and second collector contact, wherein the resistive electrical path comprises:
      a first resistive path well in which the first collector contact is formed,
      a second resistive path well separate from the first resistive path well and in which the second collector contact is formed, the first and second resistive path wells having a first conductivity type, and
      a deep buried layer also of the first conductivity type electrically connecting between the first and second resistive path wells, the deep buried layer being at least partly covered by a region of the substrate having an opposite second conductivity type.

2. The integrated circuit according to claim 1, wherein the resistor is isolated from the region having the opposite second conductivity type by a junction between the deep buried layer having the first conductivity type and the region having the opposite second conductivity type.

3. The integrated circuit according to claim 1, wherein the substrate has the opposite second conductivity type.

4. The integrated circuit according to claim 1, further comprising first and second substrate surface contacts associated with first and second collector contacts, respectively, of the resistor.

5. The integrated circuit according to claim 4, wherein the first and second substrate surface contacts are provided with an upper surface surrounded by a layer for protection against silicidation.

6. The integrated circuit according to claim 1, wherein the region having the opposite second conductivity type comprises a lightly doped layer.

7. An integrated circuit comprising:
a substrate;
an epilayer over the substrate; and
a resistor formed in the epilayer over the substrate, the resistor having a first collector contact and a second collector contact and a resistive electrical path extending between the first collector contact and second collector contact, wherein the resistive electrical path comprises:
a first resistive path well in which the first collector contact is formed,
a second resistive path well separate from the first resistive path well and in which the second collector contact is formed, the first and second resistive path wells having a first conductivity type, and
a deep buried layer electrically connecting between the first and second resistive path wells, the deep buried layer being at least partly covered by a region having an opposite second conductivity type; and
wherein the first and second resistive path wells and the deep buried layer are formed in the epilayer.

8. The integrated circuit according to claim 7, wherein the deep buried layer has the first conductivity type.

9. The integrated circuit according to claim 7, wherein the deep buried layer is lightly doped and implanted at high-energy.

10. An integrated circuit resistor, comprising:
a lightly doped deep buried layer having a first conductivity type, the deep buried layer extending along a length from a first end to a second end;
a well region having a second conductivity type overlying the lightly doped deep buried layer;
a first access well also having the first conductivity type penetrating to contact the lightly doped deep buried layer at the first end thereof;
a second access well also having the first conductivity type, wherein the second access is separate from the first access well, and the second access well penetrating to contact the lightly doped deep buried layer at the second end thereof;
a first surface contact of the resistor formed in and in electrical contact with the first access well;
a second surface contact of the resistor formed in and in electrical contact with the second access well; and
a resistive path for the integrated circuit resistor extending between the first and second surface contacts through the first access well, the second access well and the deep buried layer.

11. The integrated circuit resistor of claim 10 wherein the first and second ends are at opposed ends of the lightly doped deep buried layer.

12. An integrated circuit resistor, comprising:
an epilayer over a substrate;
a lightly doped deep buried layer formed in the epilayer and having a first conductivity type, the deep buried layer extending along a length from a first end to a second end;
a well region formed in the epilayer and having a second conductivity type overlying the lightly doped deep buried layer;
a first access well formed in the epilayer and also having the first conductivity type penetrating to contact the lightly doped deep buried layer at the first end thereof;
a second access well formed in the epilayer, wherein the second access well is separate from the first access well and also having the first conductivity type, the second access well penetrating to contact the lightly doped deep buried layer at the second end thereof;
a first surface contact of the resistor formed in and in electrical contact with the first access well;
a second surface contact of the resistor formed in and in electrical contact with the second access well; and
a resistive path for the integrated circuit resistor between the first and second surface contacts through the first access well, the second access well and the deep buried layer.

13. An integrated circuit comprising:
a substrate; and
a resistor formed in the substrate, the resistor having a first surface contact and a second surface contact and a resistive electrical path extending between the first surface contact and second surface contact, wherein the resistive electrical path comprises:
a first resistive path well in which the first surface contact is formed,
a second resistive path well separate from the first resistive path well and in which the second surface contact is formed, the first and second resistive path wells having a first conductivity type, and
a deep buried layer also of the first conductivity type electrically connecting between the first and second resistive path wells, the deep buried layer being at least partly covered by a region of the substrate having an opposite second conductivity type.

14. An integrated circuit comprising:
a substrate;
an epilayer over the substrate; and
a resistor formed in the epilayer over the substrate, the resistor having a first surface contact and a second surface contact and a resistive electrical path extending between the first surface contact and second surface contact, wherein the resistive electrical path comprises:
a first resistive path well in which the first surface contact is formed,
a second resistive path well separate from the first resistive path well and in which the second surface contact is formed, the first and second resistive path wells having a first conductivity type, and
a deep buried layer electrically connecting between the first and second resistive path wells, the deep buried layer being at least partly covered by a region having an opposite second conductivity type; and
wherein the first and second resistive path wells and the deep buried layer are formed in the epilayer.

* * * * *